United States Patent [19]

Turner et al.

[11] Patent Number: 5,409,539
[45] Date of Patent: Apr. 25, 1995

[54] SLOTTED CANTILEVER DIFFUSION TUBE SYSTEM WITH A TEMPERATURE INSULATING BAFFLE SYSTEM AND A DISTRIBUTED GAS INJECTOR SYSTEM

[75] Inventors: Charles L. Turner; Darrin C. Malinowski, both of Boise, Id.

[73] Assignee: Micron Technology, Inc., Boise, Id.

[21] Appl. No.: 62,367

[22] Filed: May 14, 1993

[51] Int. Cl.6 .............................................. C23C 16/00
[52] U.S. Cl. ................................... 118/719; 118/715; 118/724; 118/725
[58] Field of Search ................ 118/715, 719, 725, 724

[56] References Cited

U.S. PATENT DOCUMENTS

| | | | |
|---|---|---|---|
| 4,459,104 | 7/1984 | Wollmann | 432/123 |
| 4,526,534 | 7/1985 | Wollmann | 432/11 |
| 4,543,059 | 9/1985 | Whang et al. | 432/11 |
| 4,756,272 | 7/1988 | Kessler | 118/725 |
| 4,760,244 | 7/1988 | Hokynar | 118/725 |
| 4,767,251 | 8/1988 | Whang | 414/147 |
| 4,854,266 | 8/1989 | Simson | 118/725 |
| 4,911,638 | 3/1990 | Bayne | 118/725 |
| 4,992,044 | 2/1991 | Philipossian | 118/715 |
| 5,020,476 | 6/1991 | Bay | 118/725 |
| 5,029,554 | 7/1991 | Miyashita | 118/725 |
| 5,118,286 | 6/1992 | Sarin | 432/2 |
| 5,192,589 | 3/1993 | Sandhu | 427/255.1 |
| 5,320,680 | 6/1994 | Learn | 118/725 |

OTHER PUBLICATIONS

An Interactive Computer Simulation of Heating and Cooling a Row of Silicon Wafers, "Journal of the Electrochemical Society" vol. 135, No. 5, May 1988.
Consideration of Process Gas Purity During CMOS Gate Oxidation, "Proceedings Institute of Environmental Sciences" Griswold et al 1991 (pp. 719-722).
The Effect of Ambient Air Infiltration on Growth Rate and Electrical Characteristics of Ultra-Thin Silicon Dioxide Gate Insulators, (pp. 357-367) Philipossian et al.

Primary Examiner—Richard Bueker
Attorney, Agent, or Firm—Wells, St. John, Roberts, Gregory & Matkin

[57] ABSTRACT

There is a slotted cantilever diffusion tube system with a temperature insulating baffle system and a distributed gas injector system. Uniquely, there is an enhanced system that decreases the defects of wafers due to temperature, pressure, and concentration fluctuations in a low pressure chemical vapor deposition (LPCVD) process for fabricating IC wafers. Specifically, there is a cantilevered diffusion quartz tube system (12, 14) that has at least one temperature and pressure barrier baffle (28) placed between the lower temperature end (27) of the tube and the wafers under process (18). Additionally, there are at least two deposition gas injection exhaust ports (30, 32, 34) distributed along the length of the quartz tube near the wafers to assure that there is a relatively uniform concentration of diffusion gas in the heating chamber (17). Moreover, the tube has a pressure sensor (20) having its gauges on the outside of the tube and having the sensor extending into and through the baffle section and into the wafer heating chamber. Uniquely, the quartz tube (12) has gas couplings (40), located between flange ring's (22) and an oven's (14) abutting surfaces (36, 38), designed to allow for sealable and flexible attachment between the two surfaces.

23 Claims, 2 Drawing Sheets

SLOTTED CANTILEVER DIFFUSION TUBE SYSTEM WITH A TEMPERATURE INSULATING BAFFLE SYSTEM AND A DISTRIBUTED GAS INJECTOR SYSTEM

FIELD OF THE INVENTION

The present invention relates to integrated circuits (ICs). Particularly, there is a slotted cantilever diffusion tube system with a temperature insulating baffle system and a distributed gas injector system. Uniquely, there is an enhanced system that decreases the defects of wafers due to temperature, pressure, and concentration fluctuations in a low pressure chemical vapor deposition (LPCVD) process for fabricating IC wafers.

BACKGROUND OF THE INVENTION

A variety of semiconductor processing operations are commonly performed in diffusion furnaces, which in a modern semiconductor wafer fabrication facility frequently include two "stacks" of diffusion furnaces placed side by side. Each stack typically includes four horizontal quartz "diffusion tubes", each approximately eight feet long, positioned each above the other in a "diffusion furnace". The two stacks are positioned back to back, each being accessible from an opposite side. At one end of each stack is a "source cabinet" in which connections to controlled sources of various reactant gases can be made to the "pigtail" end of each diffusion tube. The opposite "mouth" end of each diffusion tube extends into a "scavenge box" into which used reactant gases are exhausted and conducted to a "scrubber" that performs the function of burning off certain components of the exhausted gases. A "load station" for each diffusion tube is connected to the loaded end of each diffusion furnace.

Those skilled in the art will realize that the foregoing arrangement of back to back stacks is necessary to minimize the amount of floor space required because it is known that an ultra-pure environment must be maintained in a modern wafer fabrication facility to avoid, to the greatest extent possible, the existence of particulates, even those in the range from 0.5 microns to 4 or 5 microns in diameter, in the ambient air. This is because it is well known that particles of this size can cause defects in the integrated circuits being manufactured in the wafers. The resulting decrease in wafer yield (and hence the increase in fabrication cost per integrated circuit) increases with the density of such particulates in the wafer fabrication environment. As state of the art of integrated circuits proceeds toward minimum line widths, and line spacings are reduced toward one micron, the minimum size of a typical particle that will cause a catastrophic defect in an integrated circuit becomes smaller and smaller. Tremendous amounts of capital have been invested by the semiconductor industry over the past decade or so to improve purity of the air and environment which is required for high yield wafer processing. Floor space in such a modern wafer fabrication facility is extremely expensive.

The various wafer processing operations mentioned above typically include semiconductor diffusion operations at high temperatures of over 1,000 degrees C., and also somewhat lower temperature processes, including thermal oxidation and LPCVD (low pressure chemical vapor deposition) processes such as deposition of silicon nitride or polycrystalline silicon on semiconductor wafers.

In order to perform the foregoing processing operations, it is necessary to load quartz diffusion boats, each holding typically 50 to 75 partially processed semiconductor wafers, into the open end of the quartz diffusion tube of a diffusion furnace. Often this has been accomplished using "paddles" which are silicon carbide platforms that are cantilevered; the wafers are loaded into a "hot zone" in the diffusion furnace, whereat the temperature of the wafers is elevated and stabilized at the desired level for the desired oxidation, diffusion, or a chemical vapor deposition process.

Problems

There are several problems with the related art. First, there is never a constant concentration of deposition chemicals in prior existing systems. This problem exists because the deposition chemicals are only entering the quartz tube from one location, and that being near the cool end of the tube. This problem should always exist because the LPCVD system works under low pressure. Therefore, the wafers closest to the vapor introduction will receive more than enough deposition but the wafers further away will have far less deposition because there is less unreacted vapor concentration remaining.

Second, the temperature in the typical LPCVD quartz tube is not as uniform as one might expect. The current tubes will hold the wafers in the hottest location in the oven, being away from the entrance of the oven. However, the one end of the tube is still cooler than the end furthest in the oven. The cooler end sticks out of the oven, the heat in the tube wall is drawn out to the cooler tube portion that is outside of the oven. The gases will absorb heat from expansion of the gas at the cooler end. The wafers at either end of the wafer stacks are not as hot since there is only one side of the wafer that is receiving heat from adjacent wafers that are radiating heat. As a result, the cooler wafers will have less material deposited thereon than the hotter wafers. Which can result in uneven deposits on the wafers, leading to either rejects, or at the least, unexceptable deposition process variations.

Considering the increased reduction in the size of die, and/or the increased amount of circuitry placed upon die, it is crucial to have finer controls over LPCVD process than were required in the recent past. Without these tighter controls on processes, the extremely small sizes in circuitry will not be able to be uniformly mass produced, or to meet the customers required tight quality control specifications, and to meet the manufactures need for low product defects.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the slotted cantilever diffusion tube system with a temperature insulating baffle system and a distributed gas injector system. Uniquely, there is an enhanced system that decreases the defects of wafers due to temperature, pressure, and concentration fluctuations in a low pressure chemical vapor deposition (LPCVD) process for fabricating IC wafers.

Specifically, there is a cantilevered diffusion quartz tube system that has at least one temperature barrier baffle placed between the lower temperature end of the tube and the wafers under process. Additionally, there are at least two deposition gas injection exhaust ports distributed along the length of the quartz tube near the wafers. Moreover, the tube has a pressure sensor having its gauges on the outside of the tube and having the sensor extending into and through the baffle section and into the wafer heating chamber. Uniquely, the quartz tube has gas couplings, located between the fitting ring's and oven's abutting surfaces, designed to allow for sealable and flexible attachment between the two surfaces.

Other features and advantages of the present invention may become more clear from the following detailed description of the invention, taken in conjunction with the accompanying drawings and claims, or may be learned by the practice of the invention.

Figure 1:
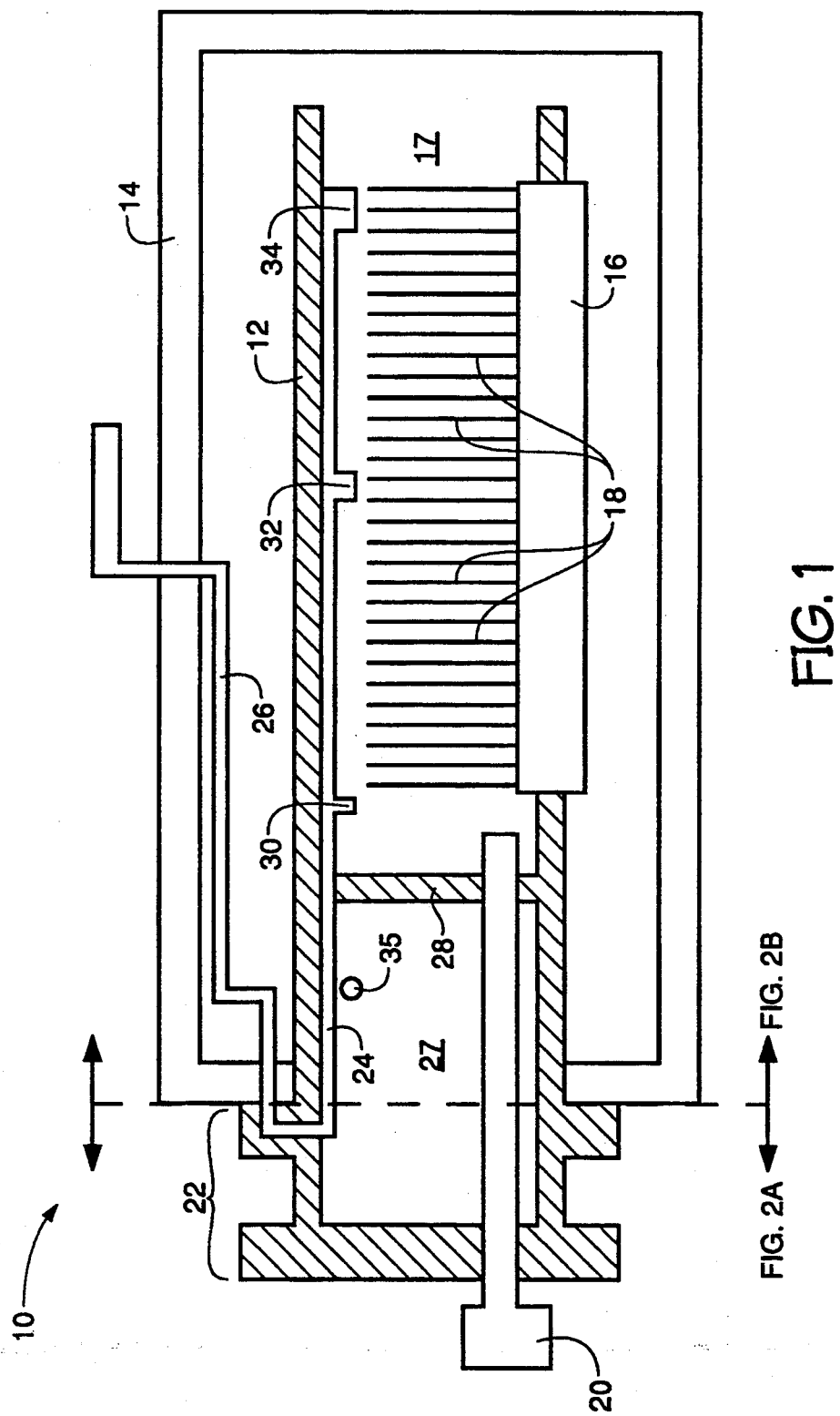
FIG. 1 is an illustration of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

Incorporated Material

The following U.S. patents are herein incorporated by reference for pertinent and supporting information:

U.S. Pat. No. 5,192,589, is a low-pressure chemical vapor deposition process for depositing thin titanium nitride films having low and stable resistivity.

U.S. Pat. No. 5,118,286, is a closed loop method and apparatus for preventing exhaused reactant gas from mixing with ambient air and enhancing repeatability of reaction gas results on wafers.

U.S. Pat. No. 4,767,251, is a cantilever apparatus and method for loading wafer boats into cantilever diffusion tubes.

U.S. Pat. No. 4,459,104, is a cantilever diffusion tube apparatus and method.

U.S. Pat. No. 4,526,534, is a cantilever diffusion tube apparatus and method.

U.S. Pat. No. 4,543,059, is a slotted cantilever diffusion tube system and method and apparatus for loading.

General Embodiment

One skilled in the cantilevered diffusion tube art will easily understand the physical layout of the tube and oven system 10, having the following elements as illustrated in FIG. 1: There is cantilevered diffusion tube 12 (tube), inserted into a cantilevered tube oven 14 (oven). The tube 12 has a wafer holder 16, for holding wafers 18 in the tube's wafer heating chamber 17. The tube 12 has a pressure sensor device 20 mounted onto the tube's flange rings 22. The flange rings 22 have a gas injection tube assembly 24 extending therethrough, and coupled to a gas supply tube 26. The tube 12 has a baffle chamber (or cool/low temperature chamber) 27 containing at least one baffle/wall 28. The gas injection tube assembly 24 extends through the baffle chamber 27, baffle 28, and extends into the length of the heating chamber 17. In the illustrated tube assembly, there are three gas injector nozzles 30, 32, and 34. There is a pressure hole 35 located in the cool chamber 27.

The baffle 28 and gas injection tube 24, are made of the same quartz crystal material as is the general cantilevered tube 12. The baffle 28, is a wall that completely seals off the low temperature chamber 27 end of the tube 12 from the heating chamber 17 end of the tube 12.

The cantilevered tube and oven system can be located through Amtech Systems, Inc., 131 South Clark, Tempe, Ariz. 85281-3008.

The illustrated invention operates as follows: Oven 14, containing cantilevered diffusion tube 12, is heated to a proper temperature. Thereby, diffusion gas is fed from the gas supply lines 26 to the gas injection tube assembly 24, routed through the cooler baffle chamber 27, through baffle 28, and into the wafer heating chamber 17. Whereby, the diffusion gas is fed into the heating chamber via gas injector nozzles 30, 32, and 34. In the illustrated arrangement, the nozzles are optimally designed to have an equal pressure of gas fed from each of the nozzles into the chamber 17. This is illustrated by having nozzle 30 smaller than 32, where 32 is smaller than 34. The diffusion gas will create a slightly higher pressure inside the tube than the ovens interior. The gas will coat the wafers, allowing the chemicals in the gas to diffuse into the surface of the wafers, and the remaining gas exiting past the openings around wafer holder 16 and out the end of the tube and flows into the oven chamber where it is drawn out of the oven (not illustrated).

Figure 2B:
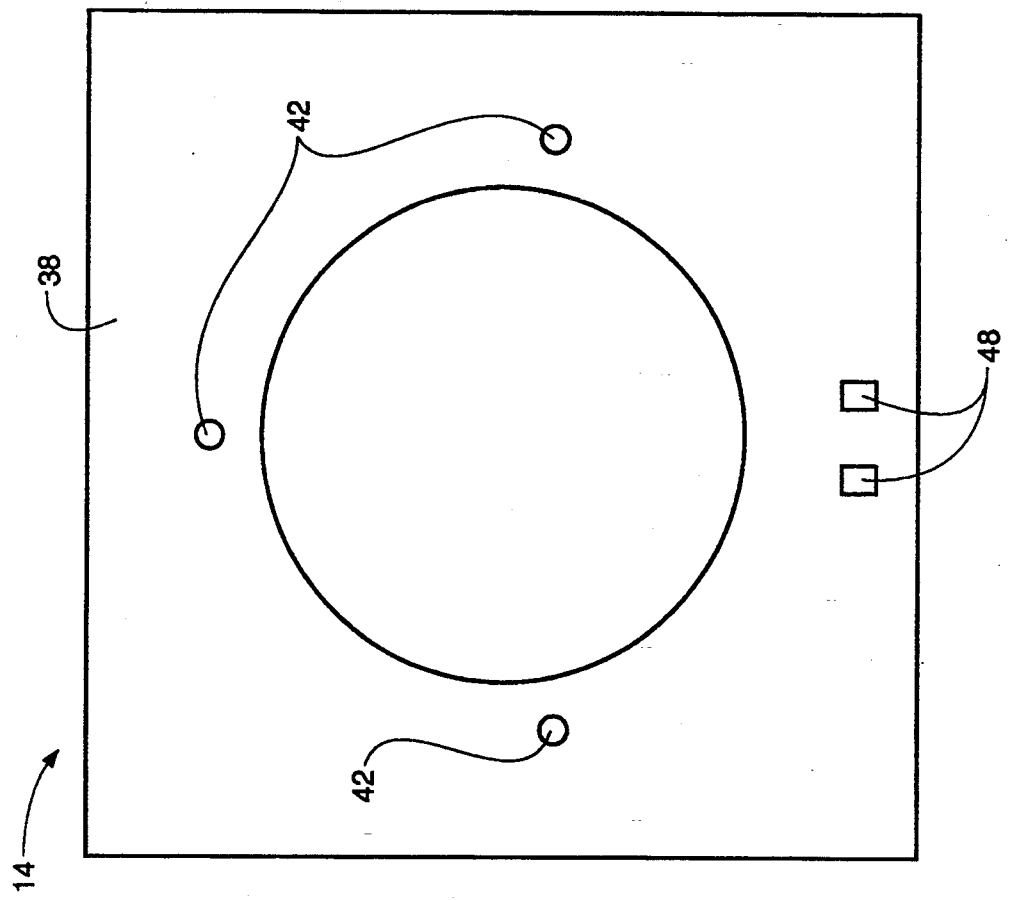
FIG. 2b is a sectional view of the oven.
Figure 2A:
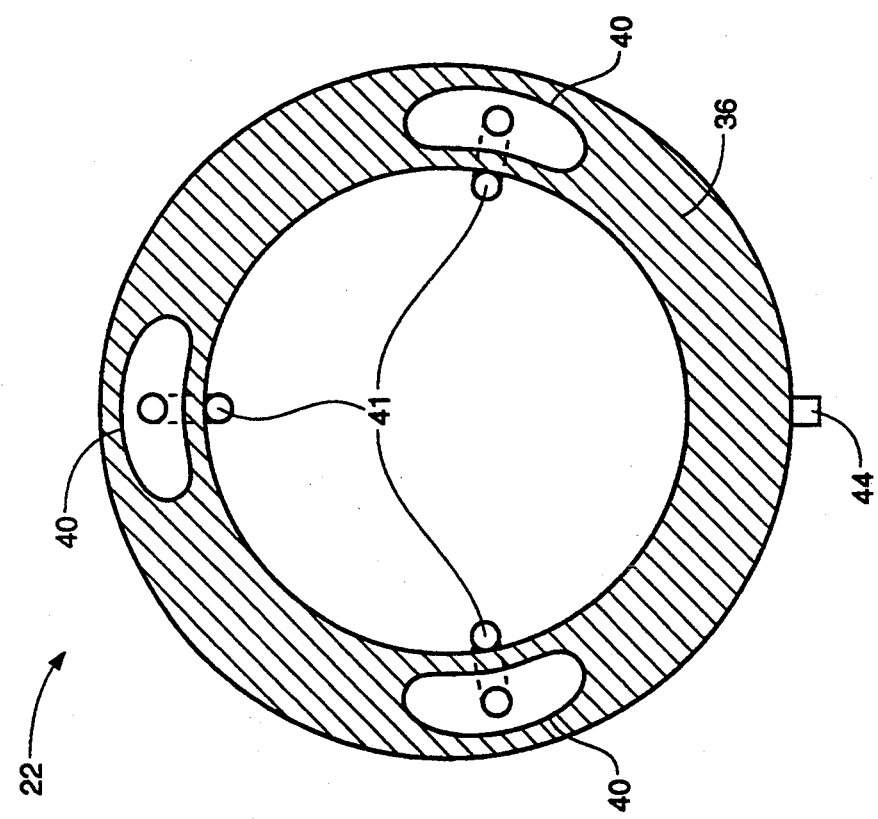
FIG. 2a is a sectional view of the tube abutting the oven face surface.

FIGS. 2a and 2b are sectional views of the tube 12 and oven 14 abutting surfaces, illustrating a gas line coupling design and a three gas supply line feeding system. In this embodiment there are three gas injection tubes 41. Similarly, other embodiments could be one gas supply line 26 that splits into three gas supply tubes 41, or there could be three gas supply lines 26 running to the tube 12. In any case, this arrangement allows for each of the three tubes 41 to have a single gas injection nozzle, where each gas tube 41 will export gas into a single different location in the wafer heating chamber 17 to gain the same results as illustrated in the single gas tube 24 three nozzle design of FIG. 1.

FIG. 2 has the following additional elements: The tube face 36 is fitted with radially curved oval like chambers 40. Usually, chambers 40 are fitted with any one of a type of elastic material "O"-rings. There is an alignment/lock mechanism having a key 44 and two projecting pieces forming a lock 48 to hold the key portion in position. There are the three gas injection tubes 41 where each extends through flange 22 and into associated chambers 40. Each tube 41 also extend into the heating chamber 17 just like tube 24 as illustrated in FIG. 1. Each tube generally having only one injector nozzle at the end thereon. Although several nozzles on each line 41 would also work.

In operation, the tube 12 is inserted into the oven. The fitting rings 22 are mounted to the oven 14. The "O"-rings will contact the oven face 38 before the tube face 36 does, and will pressure seal the chamber 40 from the outside atmosphere when the two faces (36, and 38) are forced closer together. Simultaneously, the key 44 is aligned to, or in between, the lock portion 48. Thus, the chambers 40 are relatively aligned to the ports 42.

Remarks About the Invention

It is noted that one skilled in the cantilevered tube design art will understand that by using the gas coupling chambers, as illustrated in FIG. 2a and 2b, the alignment and attachment of the tube 12 to the gas supply ports 42 will be much easier. There are no mechanical parts to manually connect the two gas lines as in the prior art, only "O"-rings that are self sealing. The tube face 36 has rotational mounting flexibility to the oven face 38 because of the chambers arched design and lock and key design. It is noted that the lock and key design do not need to be exactly and precisely aligned because of the arching chambers. This allows for manual mounting flexibility, or off alignment.

Additionally, one skilled in the heating arts will understand that the single baffle/wall 28 will aid in insulating the temperature and more advantageously assist the pressure and temperature to increase inside of the wafer heating chamber 17 as compared to the cool chamber. In this fashion a laminar gas flow is able to cover the wafers in a regulated concentration and heat and then flow to the lower pressure of the oven.

Variations in the Invention

There are several obvious variations to the broad invention and thus come within the scope of the present invention. Uniquely, this invention may work with any number of baffles 28, depending on optimum insulation between the wafer heating chamber 17 and the cooler baffle chamber.

Moreover, this invention will work with any gas injection tube supply arrangement in addition to the one discussed in FIG. 2. For example, any number of seperate tubes could deliver gas to the needed locations along the heating chamber 17, or one tube entering the tube 12 and thereby branching into several tubes after entering the heating chamber would work.

Additionally, the oval gas couplings 40 may either be fitted onto the tube face 36 or the oven face 38. Any shaped coupling 40 may work, so long as it allows for rotational adjustment and sealable attachment between the two surfaces. The locations of the chambers 40 are a matter of choice.

Similarly, the illustrated lock and key (44, 48) design can be easily modified to any number of designs that aid the alignment of the tube to the oven. The main point of the alignment, is that the physical alignment does not have to be exactly precise to get the gas ports 42 to feed gas to the tube receiving holes, illustrated by the chambers 40.

It is further noted, one skilled in the art will know that the illustrated invention will need other routine and well understood features. For example, the tube 12 may have additional support inside of the oven, to hold the tube up. The tube fitting rings may have additional ways for securing the tube to the oven, like clamps or bolts.

The oven face 38 illustrates the ports 42 are located thereon. However, these are only ports for the gas supply. Thus, these ports could also be tubes extending out from the face of the oven. Then the fitting ring face would only about to the ends of the tubes. However, the tubes would have to be adapted to have proper mounting means for coupling to the chambers 40.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A device for processing wafers in a low pressure chemical vapor deposition process comprising:
   a slotted open ended cantilever diffusion tube having a heating chamber comprising one end of the tube, a cool chamber comprising the other end of the tube, and at least one baffle positioned within the diffusion tube between the heating chamber and the cool chamber; and
   introducing means, entering the slotted cantilever diffusion tube through the cool chamber then passing through the baffle and into the heating chamber, for introducing diffusion vapor to at least two different locations along the heating chamber; and
   mounting means, attached to the diffusion tube at the cool chamber end, for coupling the introducing means to a supply of chemical vapor, the mounting means having:
   a flange, being generally perpendicular to the horizontal axis of the tube and radiating around the periphery of the tube;
   a first surface of the flange that faces in the direction of the heating chamber;
   the first surface having an oval and radially arched shaped interface chamber, the interface chamber being arched in a direction around the horizontal axis of the tube; and
   the interface chamber having an opening connecting to the introducing means.

2. A chemical vapor deposition diffusion tube for processing semiconductor wafers comprising:
   a longitudinally elongated body sized to retain a plurality of wafers;
   a peripheral mounting flange extending radially outward externally of the diffusion tube body, the mounting flange having an abutment surface configured to mountingly abut relative to a corresponding surface of a chemical vapor deposition furnace with which the diffusion tube is adapted to be used;
   a first gas injection passageway extending radially of the tube body through the mounting flange;
   a second gas injection passageway extending longitudinally along the body and having at least one orifice positioned to eject deposition gases within the tube body; and
   the first and the second gas diffusion passageways being in fluid communication.

3. The chemical vapor deposition diffusion tube of claim 2 wherein the first injection passageway extends from a position internally of the tube body radially through the flange to the flange abutment surface.

4. The chemical vapor deposition diffusion tube of claim 3 further comprising:
 a chamber defined relative to the flange abutment surface and joining with the first passageway, the first passageway having a cross sectional area where it joins with the chamber, the chamber having a cross sectional area taken along a line parallel to the flange abutment surface which is greater than the joining first passageway cross sectional area.

5. The chemical vapor deposition diffusion tube of claim 4 wherein the chamber is at least in part defined by a flexible sealing ring which seals between the flange abutment surface and a chemical vapor deposition furnace with which the diffusion tube is adapted to be used.

6. The chemical vapor deposition diffusion tube of claim 4 wherein the chamber is elongated along a line running parallel to the abutment surface.

7. The chemical vapor deposition diffusion tube of claim 4 wherein the chamber is elongated along an arcuate line running parallel to the abutment surface.

8. The chemical vapor deposition diffusion tube of claim 4 wherein,
 the chamber is at least in part defined by a flexible sealing ring which seals between the flange abutment surface and a chemical vapor deposition furnace with which the diffusion tube is adapted to be used; and
 the chamber is elongated along a line running parallel to the abutment surface.

9. The chemical vapor deposition diffusion tube of claim 4 wherein,
 the chamber is at least in part defined by a flexible sealing ring which seals between the flange abutment surface and a chemical vapor deposition furnace with which the diffusion tube is adapted to be used; and
 the chamber is elongated along an arcuate line running parallel to the abutment surface.

10. A chemical vapor deposition furnace for processing semiconductor wafers comprising:
 a furnace body, the furnace body having an external abutment surface;
 a wafer processing diffusion tube mounted to the furnace body:
  a longitudinally elongated body sized to retain a plurality of wafers;
  a peripheral mounting flange extending radially outward externally of the diffusion tube body, the mounting flange having an abutment surface mountingly abutting relative to the external furnace body abutment surface;
  a first gas injection passageway extending radially of the tube body through the mounting flange;
  a second gas injection passageway extending longitudinally along the body and having at least one orifice positioned to eject deposition gases within the tube body; and
  the first and the second gas diffusion passageways being in fluid communication.

11. The furnace of claim 10 wherein the first injection passageway extends from a position internally of the tube body radially through the flange to the flange abutment surface.

12. The furnace of claim 10 further comprising:
 a chamber defined relative to the flange abutment surface and the furnace abutment surface, the chamber joining with the first passageway, the first passageway having a cross sectional area where it joins with the chamber, the chamber having a cross sectional area taken along a line parallel to the flange abutment surface which is greater than the joining first passageway cross sectional area.

13. The furnace of claim 10 wherein the chamber is at least in part defined by a flexible sealing ring which seals between the flange abutment surface and the furnace abutment surface.

14. The furnace of claim 10 wherein the chamber is elongated along a line running parallel to the abutment surface.

15. The furnace of claim 10 wherein the chamber is elongated along an arcuate line running parallel to the abutment surface.

16. The furnace of claim 10 wherein,
 the chamber is at least in part defined by a flexible sealing ring which seals between the flange abutment surface and a chemical vapor deposition furnace with which the diffusion tube is adapted to be used; and
 the chamber is elongated along a line running parallel to the abutment surface.

17. The furnace of claim 10 wherein,
 the chamber is at least in part defined by a flexible sealing ring which seals between the flange abutment surface and a chemical vapor deposition furnace with which the diffusion tube is adapted to be used; and
 the chamber is elongated along an arcuate line running parallel to the abutment surface.

18. The furnace of claim 10 wherein the first injection passageway extends from a position internally of the tube body radially through the flange to the flange abutment surface, the furnace further comprising:
 a chamber defined relative to the flange abutment surface and the furnace abutment surface, the chamber joining with the first passageway, the first passageway having a cross sectional area where it joins with the chamber, the chamber having a cross sectional area taken along a line parallel to the flange abutment surface which is greater than the joining first passageway cross sectional area; and
 a third gas injection passageway extending through the furnace body to the furnace body external abutment surface, the third gas injection passageway being in fluid communication with the first gas injection passageway through the chamber.

19. The furnace of claim 18 wherein the chamber is at least in part defined by a flexible sealing ring which seals between the flange abutment surface and the furnace abutment surface.

20. The furnace of claim 18 wherein the chamber is elongated along a line running parallel to the abutment surface.

21. The furnace of claim 18 wherein the chamber is elongated along an arcuate line running parallel to the abutment surface.

22. The furnace of claim 18 wherein,
 the chamber is at least in part defined by a flexible sealing ring which seals between the flange abutment surface and a chemical vapor deposition furnace with which the diffusion tube is adapted to be used; and
 the chamber is elongated along a line running parallel to the abutment surface.

23. The furnace of claim 18 wherein, the chamber is at least in part defined by a flexible sealing ring which seals between the flange abutment surface and a chemical vapor deposition furnace with which the diffusion tube is adapted to be used; and the chamber is elongated along an arcuate line running parallel to the abutment surface.

* * * * *